(12) United States Patent
Kadoguchi et al.

(10) Patent No.: US 10,950,526 B2
(45) Date of Patent: Mar. 16, 2021

(54) SEMICONDUCTOR DEVICE

(71) Applicant: DENSO CORPORATION, Aichi-pref (JP)

(72) Inventors: Takuya Kadoguchi, Toyota (JP); Satoshi Takahagi, Nagakute (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/543,965

(22) Filed: Aug. 19, 2019

(65) Prior Publication Data

US 2020/0091042 A1 Mar. 19, 2020

(30) Foreign Application Priority Data

Sep. 18, 2018 (JP) .............................. JP2018-174049

(51) Int. Cl.
*H01L 23/492* (2006.01)
*H01L 23/31* (2006.01)
(Continued)

(52) U.S. Cl.
CPC .......... *H01L 23/492* (2013.01); *H01L 21/565* (2013.01); *H01L 23/3121* (2013.01);
(Continued)

(58) Field of Classification Search
CPC ... H01L 2224/1203; H01L 2224/49171; H01L 2224/48175; H01L 2224/83801; H01L 2224/2901; H01L 2224/0603; H01L 2224/4025; H01L 2224/33181; H01L 2224/3224; H01L 2224/32245; H01L 2224/73265; H01L 2224/48247; H01L 2924/1203; H01L 2924/13055; H01L 2924/00014; H01L 2924/181; H01L 21/565; H01L 25/18; H01L 25/0655;
(Continued)

(56) References Cited

U.S. PATENT DOCUMENTS

2007/0221704 A1* 9/2007 Takakusaki .......... B23K 35/025
228/101
2012/0261811 A1* 10/2012 Nakanishi ............... H01L 23/36
257/712
(Continued)

FOREIGN PATENT DOCUMENTS

| JP | 2014-154779 A | 5/2014 |
|---|---|---|
| JP | 6001472 B2 | 10/2016 |
| JP | 6001473 B2 | 10/2016 |

*Primary Examiner* — Galina G Yushina
(74) *Attorney, Agent, or Firm* — Sughrue Mion, PLLC

(57) ABSTRACT

A semiconductor device may include a first conductor plate, a first semiconductor element that is a sole semiconductor element disposed on a main surface of the first conductor plate, an encapsulant encapsulating the first semiconductor element and a first power terminal connected to the first conductor plate within the encapsulant and projecting from the encapsulant along a first direction. The main surface of the first conductor plate may include a first side located close to the first power terminal and a second side located opposite the first side with respect to the first direction. With respect to the first direction, a distance from the first semiconductor element to the first side may be larger than a distance from the first semiconductor element to the second side.

4 Claims, 9 Drawing Sheets

(51) Int. Cl.
*H01L 25/065* (2006.01)
*H01L 23/00* (2006.01)
*H01L 21/56* (2006.01)

(52) U.S. Cl.
CPC .......... *H01L 25/0655* (2013.01); *H01L 24/48* (2013.01); *H01L 24/49* (2013.01); *H01L 2224/48175* (2013.01); *H01L 2224/49171* (2013.01); *H01L 2924/1203* (2013.01); *H01L 2924/13055* (2013.01)

(58) Field of Classification Search
CPC ......... H01L 24/49; H01L 24/73; H01L 24/33; H01L 24/40; H01L 24/83; H01L 24/32; H01L 24/29; H01L 23/3107; H01L 23/49575; H01L 23/3677; H01L 23/4922; H01L 23/3672; H01L 23/49568; H01L 23/051; H01L 23/492; H01L 23/3121; H01L 23/49537; H01L 23/4334
See application file for complete search history.

(56) References Cited

U.S. PATENT DOCUMENTS

2017/0033710 A1* 2/2017 Muto ................ H01L 23/49541
2017/0278774 A1* 9/2017 Hayashi ............. H01L 23/4334

* cited by examiner

SEMICONDUCTOR DEVICE

CROSS-REFERENCE TO RELATED APPLICATION

This application claims priority to Japanese Patent Application No. 2018-174049, filed on Sep. 18, 2018, the entire contents of which are incorporated herein by reference.

TECHNICAL FIELD

The technology disclosed herein relates to a semiconductor device.

BACKGROUND

Japanese Patent Application Publication No. 2014-154779 describes a semiconductor device. This semiconductor device includes conductor plates, two semiconductor elements disposed on the conductor plates, and power terminals extending from the conductor plates.

SUMMARY

In the above-described semiconductor device, the two semiconductor elements are disposed on their corresponding conductor plates in a balanced manner. As such, in conventional semiconductor devices, one or more semiconductor elements are disposed on a conductor plate in a balanced manner. A semiconductor device where a sole semiconductor element is present on a conductor plate, therefore, is usually designed such that the semiconductor element is located at a center of the conductor plate. However, the semiconductor device does not necessarily have a symmetric structure, and its power terminal, for example, is often provided only on one side of the conductor plate. In this case, not disposing the semiconductor element simply at the center of the conductor plate, a positional relation between the semiconductor element and the power terminal should be taken into account to dispose the semiconductor element on the conductor plate. The disclosure herein provides a technology for this, which enables improvement in a semiconductor device.

A semiconductor device disclosed herein may comprise a first conductor plate, a first semiconductor element that is a sole semiconductor element disposed on a main surface of the first conductor plate, an encapsulant encapsulating the first semiconductor element, and a first power terminal connected to the first conductor plate within the encapsulant and projecting from the encapsulant along a first direction. The main surface of the first conductor plate may comprise a first side located close to the first power terminal and a second side located opposite the first side with respect to the first direction. With respect to the first direction, a distance from the first semiconductor element to the first side may be larger than a distance from the first semiconductor element to the second side. It should be noted that "a first semiconductor element that is a sole semiconductor element disposed on a main surface of the first conductor plate" means that only a single semiconductor element is present on the first conductor plate, which is called a first semiconductor element herein.

In the above-described semiconductor device, the first power terminal is connected to the first conductor plate. In such a configuration, heat of the first power terminal could transfer to the first semiconductor element via the first conductor plate. For example, the first power terminal may generate heat since the first power terminal allows a relatively large current to flow therein. Moreover, the first power terminal is often welded to an external circuit member (e.g., a bus bar), and tends to generate relatively large amount of heat at its welded site. If such heat transfers to the first semiconductor element, a temperature of the first semiconductor element is thereby risen, which may, for example, create a need to restrict an operation of the first semiconductor element. In this regard, the structure of the above-described semiconductor device allows the first semiconductor element to be disposed not at a center of the first conductor plate, but at a position relatively apart from the first power terminal. This suppresses transfer of the heat of the first power terminal to the first semiconductor element via the first conductor plate.

DETAILED DESCRIPTION

Figure 1:
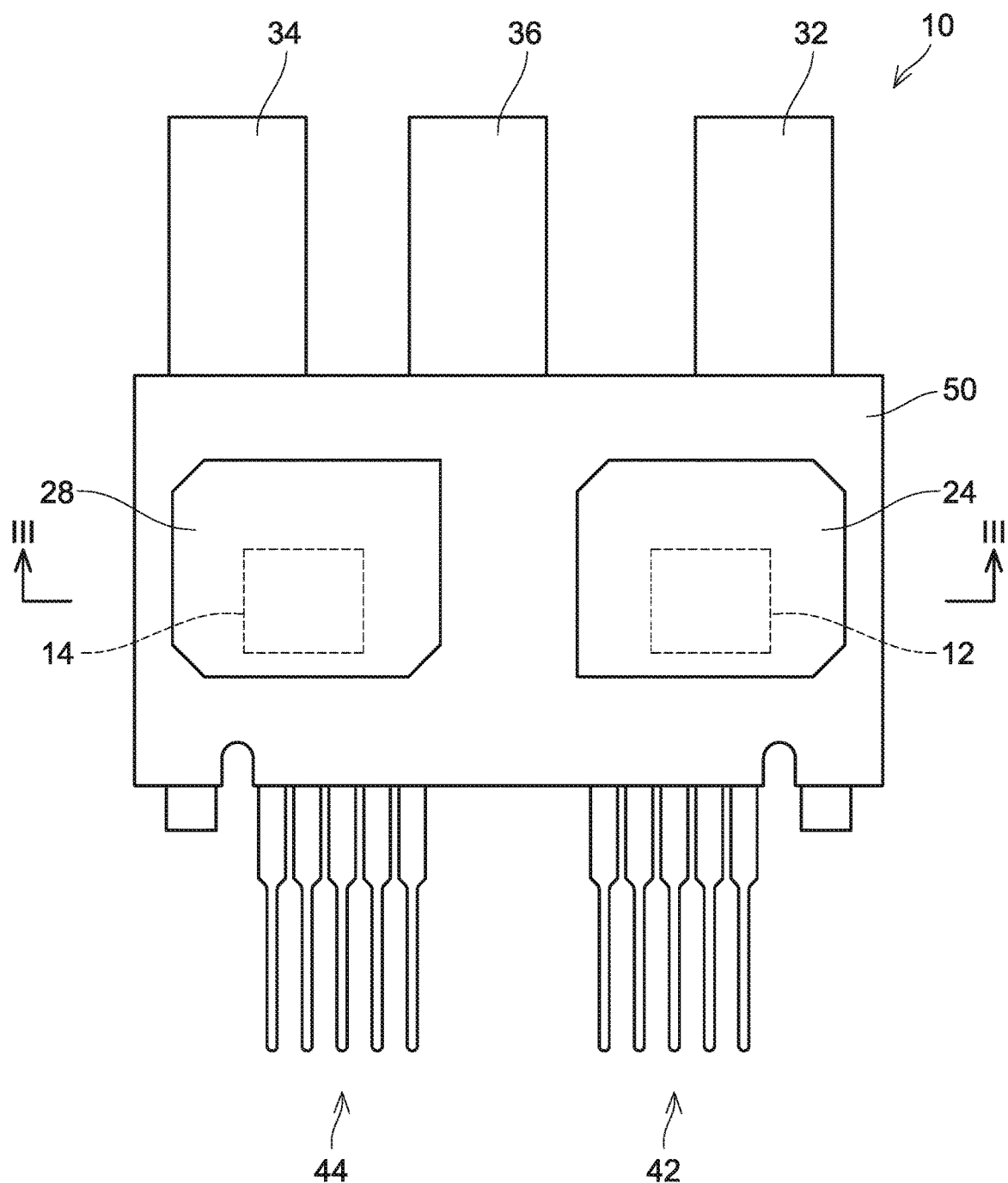
FIG. 1 is a plan view of a semiconductor device 10 in an embodiment.
Figure 2:
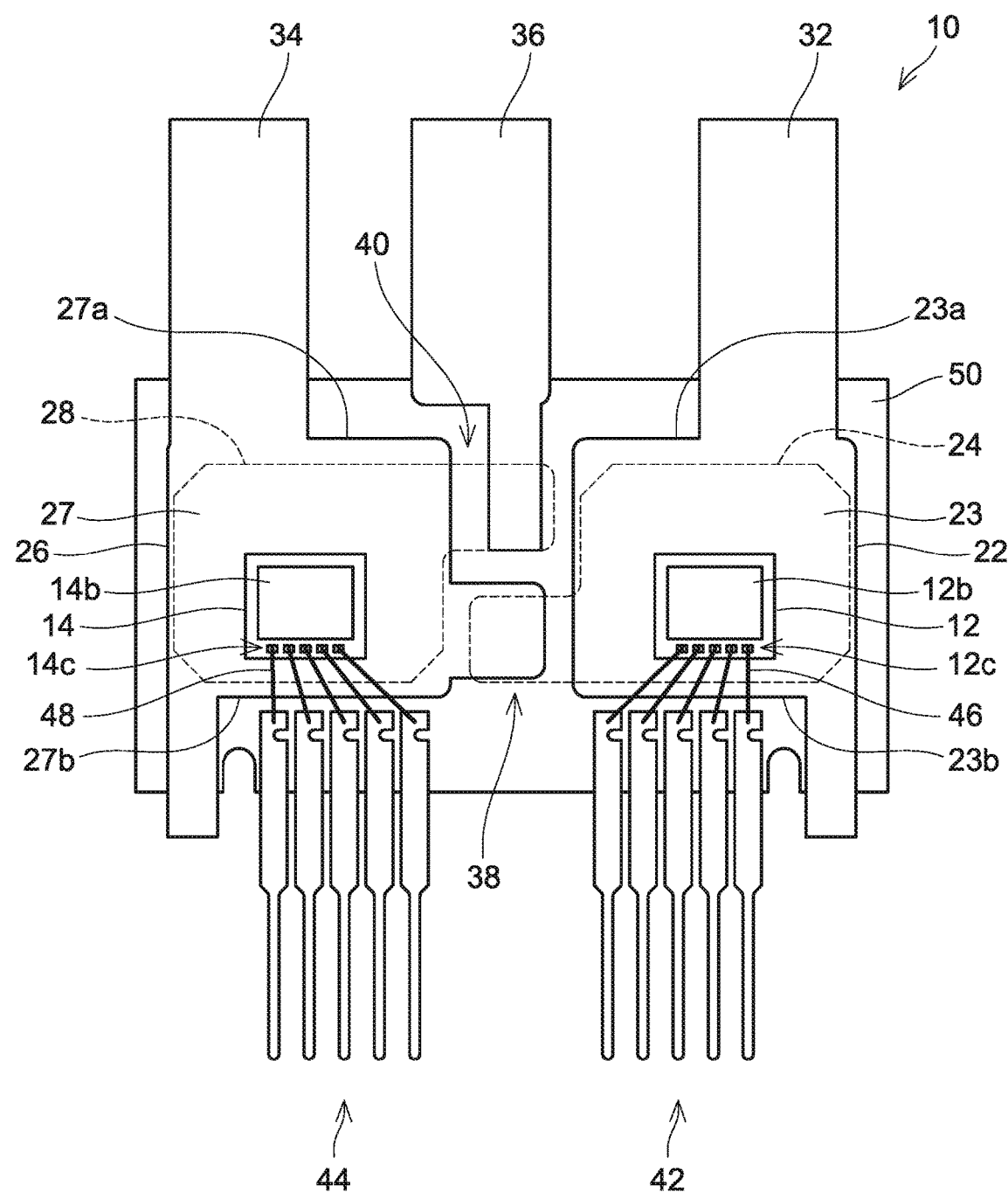
FIG. 2 shows an internal structure of the semiconductor device 10 in a plan view along a direction perpendicular to conductor plates 22, 24, 26, 28.
Figure 3:
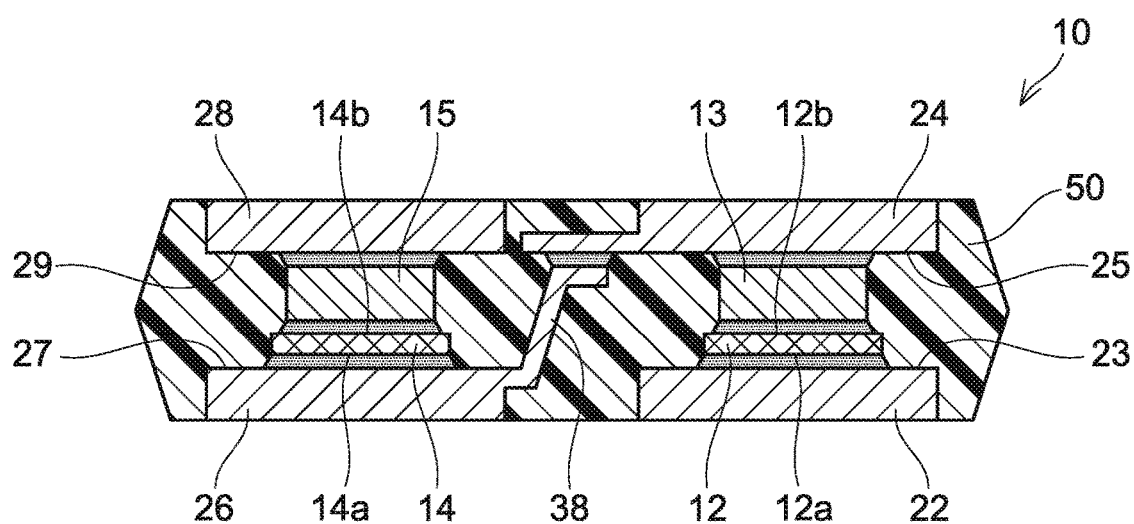
FIG. 3 is a cross-sectional view along a line III-III in FIG. 1.
Figure 4:
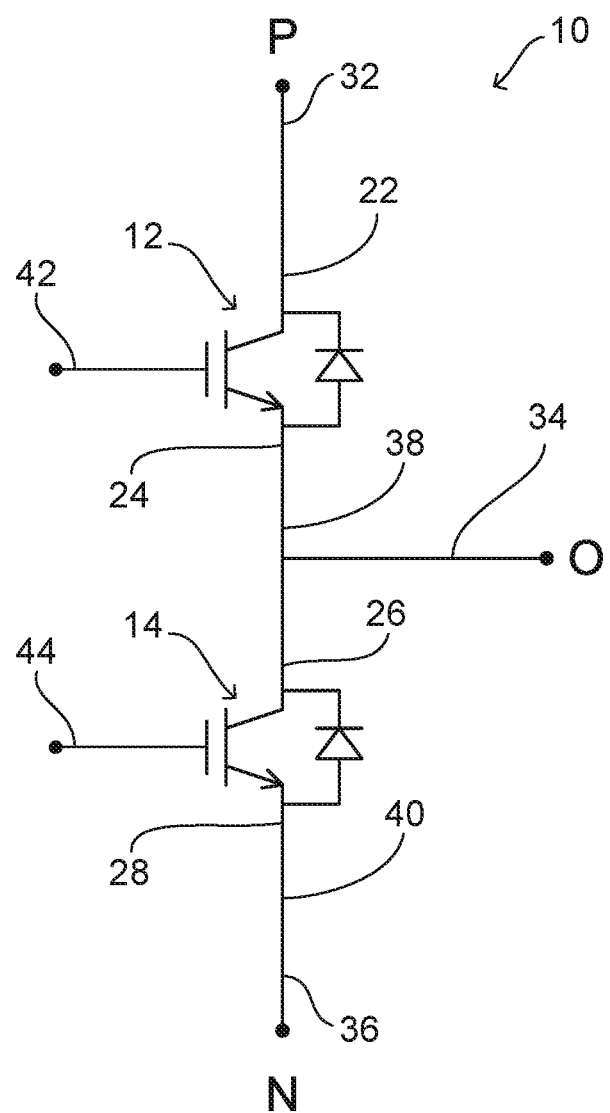
FIG. 4 shows a circuit structure of the semiconductor device 10.

In an embodiment of the present technology, the distance from the first semiconductor element to the first side may be equal to or larger than a half of a size of the first semiconductor element with respect to the abovementioned first direction (i.e., a direction in which the first power terminal projects). As such, the distance from the first semiconductor element to the first side (which is approximately a distance from the first semiconductor element to the first power terminal) may be set sufficiently larger than that in conventional semiconductor devices. This can effectively suppress transfer of the heat of the first power terminal to the first semiconductor element via the first conductor plate.

In an embodiment of the present technology, with respect to the first direction, the distance from the first semiconductor element to the first side may be at least twice the distance from the first semiconductor element to the second side. As such, the first semiconductor element may be disposed to be sufficiently offset relative to the center of the first conductor plate. This can effectively suppress transfer of the heat of the first power terminal to the first semiconductor element via the first conductor plate.

In an embodiment of the present technology, the semiconductor device may further comprise a second conductor plate opposed to the first conductor plate with the first semiconductor element interposed therebetween, and the second conductor plate may comprise a main surface connected to the first semiconductor element within the encapsulant. However, if the semiconductor device includes the second conductor plate, the heat of the first power terminal could transfer to the first semiconductor element via the encapsulant and the second conductor plate. Therefore, in an embodiment, the main surface of the second conductor plate may comprise a first side located close to the first power terminal and a second side located opposite the first side with respect to the first direction. Then, with respect to the first direction, a distance from the first semiconductor element to the first side of the second conductor plate may be larger than a distance from the first semiconductor element to the second side of the second conductor plate. Such a configuration can suppress transfer of the heat of the first power terminal to the first semiconductor element via the encapsulant and the second conductor plate (especially via the second conductor plate).

In an embodiment of the present technology, the semiconductor device may further comprise a third conductor plate located side by side with the first conductor plate in a second direction perpendicular to the first direction, a second semiconductor element that is a sole semiconductor element disposed on a main surface of the third conductor plate within the encapsulant, and a second power terminal connected to the third conductor plate within the encapsulant and projecting from the encapsulant along the first direction. However, in such a structure, heat of the second power terminal could transfer to the second semiconductor element via the third conductor plate. Therefore, in an embodiment, the main surface of the third conductor plate may comprise a first side located close to the second power terminal and a second side located opposite the first side with respect to the first direction. Then, with respect to the first direction, a distance from the second semiconductor element to the first side of the third conductor plate may be larger than a distance from the second semiconductor element to the second side of the third conductor plate. Such a configuration can suppress transfer of the heat of the second power terminal to the second semiconductor element via the third conductor plate. It should be noted that "a second semiconductor element that is a sole semiconductor element disposed on a main surface of the third conductor plate" means that only a single semiconductor element is present on the third conductor plate, which is called a second semiconductor element herein.

In an embodiment of the present technology, the third conductor plate may be connected to the second conductor plate via a first connector portion located between the second conductor plate and the third conductor plate. In this case, in a plan view along a direction perpendicular to the third conductor plate, at least a half of the first semiconductor element and at least a half of the second semiconductor element may be each located within a region defined by virtually expanding the first connector portion in the second direction. Such a configuration allows the first connector portion to be disposed relatively near the first semiconductor element and the second semiconductor element. This shortens a current path between the first semiconductor element and the first connector portion, and a current path between the second semiconductor element and the first connector portion, thus electrical loss in these paths can be reduced.

In an embodiment of the present technology, the semiconductor device may further comprise a fourth conductor plate opposed to the third conductor plate with the second semiconductor element interposed therebetween, and a third power terminal connected to the fourth conductor plate within the encapsulant and projecting from the encapsulant along the first direction. In this case, the fourth conductor plate may be located side by side with the second conductor plate in the second direction and may be connected to the third power terminal via a second connector portion. Then, in a plan view along a direction perpendicular to the fourth conductor plate, the second connector portion may be located between the second conductor plate and the fourth conductor plate and may be further located between the third power terminal and the first connector portion.

In the above-described embodiment, in the plan view along the direction perpendicular to the fourth conductor plate, neither the first semiconductor element nor the second semiconductor element may be located within a region defined by virtually expanding the second connector portion in the second direction, although not particularly limited thereto. Such a configuration allows the first semiconductor element and the second semiconductor element to be located apart from the second connector portion and the third power terminal, and hence can suppress transfer of heat of the third power terminal to the first semiconductor element and the second semiconductor element.

Representative, non-limiting examples of the present disclosure will now be described in further detail with reference to the attached drawings. This detailed description is merely intended to teach a person of skill in the art further details for practicing aspects of the present teachings and is not intended to limit the scope of the present disclosure. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

EMBODIMENTS

With reference to the drawings, a semiconductor device 10 in an embodiment will be described. The semiconductor device 10 in the present embodiment is a power semiconductor device, and can be used for a power conversion circuit, such as a converter and an inverter, in an electric-powered vehicle, such as an electric vehicle, a hybrid vehicle, and a fuel-cell vehicle. However, application of the semiconductor device 10 is not limited particularly. The semiconductor device 10 can be widely adopted for various devices and circuits.

As shown in FIGS. 1 to 4, the semiconductor device 10 includes a first semiconductor element 12, a second semiconductor element 14, and an encapsulant 50 encapsulating these semiconductor elements 12, 14. The encapsulant 50 is constituted of an insulating material. The encapsulant 50 in the present embodiment is formed by molding an encapsulating material (e.g., an epoxy resin) with use of a mold 100 (see FIGS. 8 and 9), although not particularly limited thereto.

The two semiconductor elements 12, 14 are power semiconductor elements, and have configurations identical to each other. The first semiconductor element 12 includes a lower electrode 12a, an upper electrode 12b, and a plurality of signal pads 12c. The lower electrode 12a is located on a lower surface of the first semiconductor element 12, and the upper electrode 12b and the plurality of signal pads 12c are located on an upper surface of the first semiconductor element 12. Similarly, the second semiconductor element 14 includes a lower electrode 14a, an upper electrode 14b, and a plurality of signal pads 14c.

As an example, the semiconductor elements 12, 14 are each a Reverse Conducting (RC)-Insulated Gate Bipolar Transistor (IGBT) in which an IGBT and a diode are integrally provided in a single semiconductor substrate. Collectors of the IGBTs and cathodes of the diodes are connected to the corresponding lower electrodes 12a, 14a, and emitters of the IGBTs and anodes of the diodes are connected to the corresponding upper electrodes 12b, 14b. The semiconductor elements 12, 14 are each not limited to an RC-IGBT, and may be a power semiconductor element of another type, simply such as an IGBT and a Metal-Oxide-Semiconductor Field-Effect Transistor (MOSFET). Moreover, a material of their semiconductor substrates is not limited particularly, and may be, for example, silicon (Si), silicon carbide (SiC), or a nitride semiconductor.

The semiconductor device 10 further includes a first conductor plate 22, a second conductor plate 24, a third conductor plate 26, and a fourth conductor plate 28. The conductor plates 22, 24, 26, 28 are each constituted of a conductor such as copper or another metal. The conductor plates 22, 24, 26, 28 may each be a laminated substrate (also termed an insulated substrate) that includes an insulator substrate and a conductor layer formed on the insulator substrate. The first conductor plate 22 and the second conductor plate 24 are opposed to each other, and the first semiconductor element 12 is interposed therebetween. The lower electrode 12a of the first semiconductor element 12 is soldered to a main surface 23 of the first conductor plate 22, and the upper electrode 12b of the first semiconductor element 12 is soldered to a main surface 25 of the second conductor plate 24 via a conductor spacer 13. The main surface 23 of the first conductor plate 22 and the main surface 25 of the second conductor plate 24 are located within the encapsulant 50 and are opposed to each other.

Similarly, the third conductor plate 26 and the fourth conductor plate 28 are opposed to each other, and the second semiconductor element 14 is interposed therebetween. The lower electrode 14a of the second semiconductor element 14 is soldered to a main surface 27 of the third conductor plate 26, and the upper electrode 14b of the second semiconductor element 14 is soldered to a main surface 29 of the fourth conductor plate 28 via a conductor spacer 15. The main surface 27 of the third conductor plate 26 and the main surface 29 of the fourth conductor plate 28 are located within the encapsulant 50 and are opposed to each other.

The third conductor plate 26 is electrically connected to the second conductor plate 24 at a first connector portion 38 located within the encapsulant 50. The first semiconductor element 12 and the second semiconductor element 14 are thereby electrically connected in series. As an example, the first connector portion 38 is located between the second conductor plate 24 and the third conductor plate 26, a part of the first connector portion 38 is integrally configured with the second conductor plate 24, and another part thereof is integrally configured with the third conductor plate 26. As another embodiment, at least a part of the first connector portion 38 may be configured as a member independent of the second conductor plate 24 and the third conductor plate 26.

The first conductor plate 22 is exposed to outside at a lower surface of the encapsulant 50, and the second conductor plate 24 is exposed to outside at an upper surface of the encapsulant 50. As such, the first conductor plate 22 and the second conductor plate 24 configure part of conductive paths in the semiconductor device 10 as well as function as heat-dissipating plates that dissipate heat of the first semiconductor element 12 to outside. Similarly, the third conductor plate 26 is exposed to outside at the lower surface of the encapsulant 50, and the fourth conductor plate 28 is exposed to outside at the upper surface of the encapsulant 50. As such, the third conductor plate 26 and the fourth conductor plate 28 also configure part of conductive paths in the semiconductor device 10 as well as function as heat-dissipating plates that dissipate heat of the second semiconductor element 14 to outside.

The semiconductor device 10 further includes a first power terminal 32 (a P terminal), a second power terminal 34 (an O terminal), and a third power terminal 36 (an N terminal). The power terminals 32, 34, 36 each extend across inside and outside the encapsulant 50. As an example, the three power terminals 32, 34, 36 are parallel to one another and project from the encapsulant 50 along a first direction (up-down direction in FIGS. 1 and 2). The first power terminal 32 is connected to the first conductor plate 22 within the encapsulant 50. The second power terminal 34 is connected to the third conductor plate 26 within the encapsulant 50. The third power terminal 36 is connected to the fourth conductor plate 28 within the encapsulant 50.

In the present embodiment, the first power terminal 32 is configured integrally with the first conductor plate 22, and the second power terminal 34 is configured integrally with the third conductor plate 26, although not particularly limited thereto. The third power terminal 36 is connected to the fourth conductor plate 28 via a second connector portion 40. As an example, the second connector portion 40 is located between the second conductor plate 24 and the fourth conductor plate 28, a part of the second connector portion 40 is configured integrally with the fourth conductor plate 28, and another part thereof is configured integrally with the third power terminal 36. As another embodiment, at least a part of the second connector portion 40 may be configured as a member independent of the fourth conductor plate 28 and the third power terminal 36.

The semiconductor device 10 further includes a plurality of first signal terminals 42 and a plurality of second signal terminals 44. These signal terminals 42, 44 are located opposite the three power terminals 32, 34, 36. The signal terminals 42, 44 each extend across inside and outside the encapsulant 50. The first signal terminals 42 are parallel to one another and project from the encapsulant 50 along the first direction (the up-down direction in FIGS. 1 and 2). Each of the first signal terminals 42 is connected to corresponding one of the signal pads 12c of the first semiconductor element 12 within the encapsulant 50. The plurality of first signal terminals 42 includes, for example, a gate signal terminal connected to a gate of the IGBT of the first semiconductor element 12 (see FIG. 4). In the present embodiment, the first signal terminals 42 and the signal pads 12c are connected via bonding wires 46. As another embodiment, the first signal terminals 42 and the signal pads 12c may be directly connected by, for example, soldering, brazing, or the like.

Similarly, the second signal terminals 44 are parallel to one another and project from the encapsulant 50 along the first direction. Each of the second signal terminals 44 is connected to corresponding one of the signal pads 14c of the second semiconductor element 14 within the encapsulant 50. The plurality of second signal terminals 44 includes, for example, a gate signal terminal connected to a gate of the IGBT of the second semiconductor element 14. In the present embodiment, the second signal terminals 44 and the signal pads 14c are connected via bonding wires 48. As another embodiment, the second signal terminals 44 and the signal pads 14c may be directly connected by, for example, soldering, brazing, or the like.

According to the above configuration, in the semiconductor device 10 of the present embodiment, the first power terminal 32 and the second power terminal 34 are connected via the first semiconductor element 12, and the second power terminal 34 and the third power terminal 36 are connected via the second semiconductor element 14. Providing a gate-drive signal via one of the first signal terminals 42 can turn on and off the IGBT of the first semiconductor element 12. Moreover, providing a gate-drive signal via one of the second signal terminals 44 can turn on and off the IGBT of the second semiconductor element 14. The semiconductor device 10 in the present embodiment has such a configuration, and thus can configure a pair of upper and lower arms in a power conversion circuit such as a converter and an inverter.

In the semiconductor device 10 in the present embodiment, the first power terminal 32 is connected to the first conductor plate 22. In such a configuration, heat of the first power terminal 32 could transfer to the first semiconductor element 12 via the first conductor plate 22. For example, the first power terminal 32 may generate heat since it allows a relatively large current to flow therein. Moreover, the first power terminal 32 is often welded to an external circuit member (e.g., a bus bar), and tends to generate relatively large amount of heat at its welded site. If such heat transfers to the first semiconductor element 12, a temperature of the first semiconductor element 12 is thereby risen, which may create a need to restrict an operation of the first semiconductor element 12.

Figure 5:
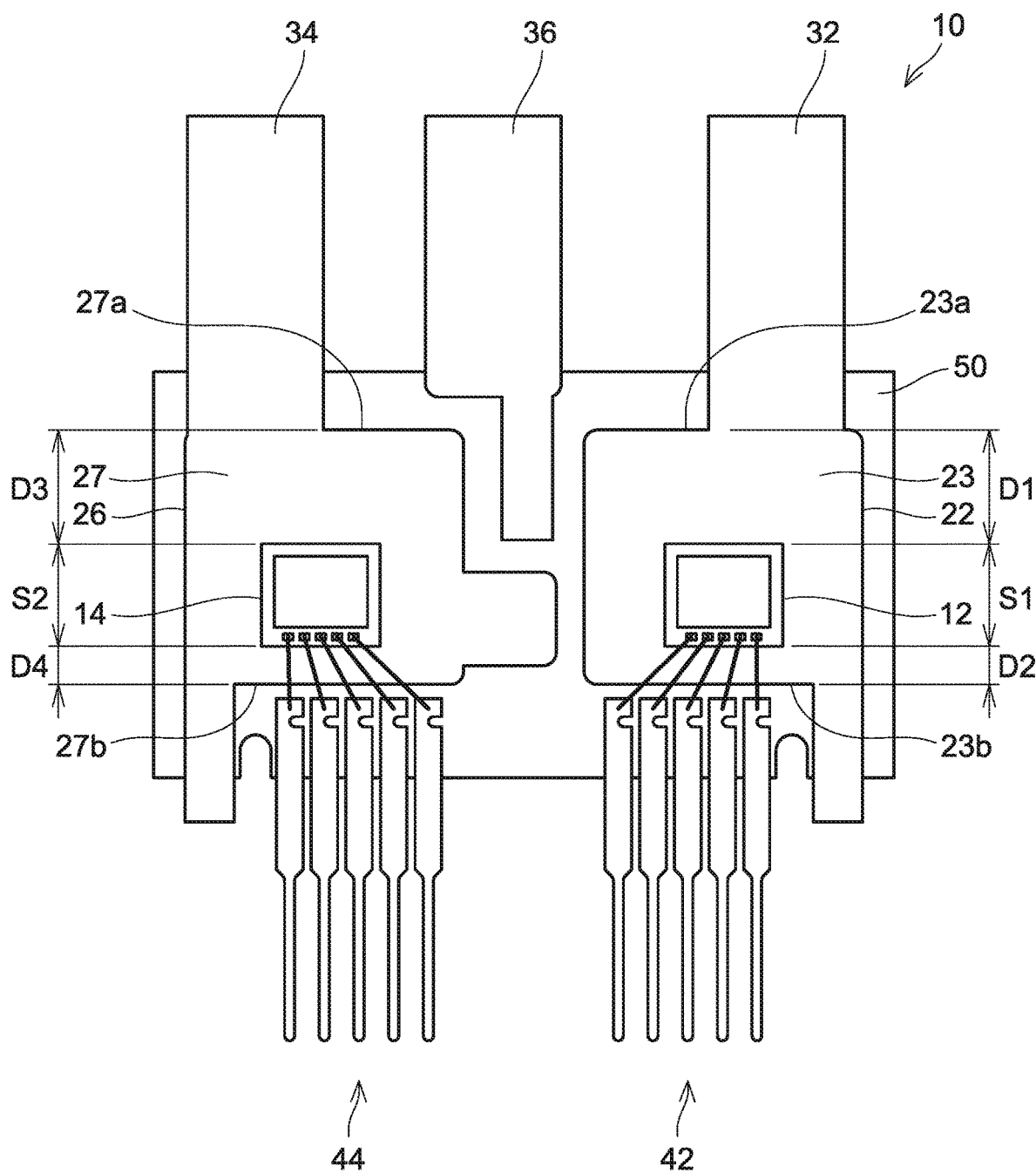
FIG. 5 is a diagram for explaining an arrangement of a first semiconductor element 12 relative to the first conductor plate 22, and an arrangement of a second semiconductor element 14 relative to the third conductor plate 26.

In this regard, in the semiconductor device 10 in the present embodiment, the first semiconductor element 12 is offset relative to a center of the first conductor plate 22, to be apart from the first power terminal 32. Specifically, as shown in FIG. 5, the main surface 23 of the first conductor plate 22 has a generally rectangular shape, and includes a first side 23a located close to the first power terminal 32 and a second side 23b located opposite the first side 23a with respect to the first direction. With respect to the first direction, a distance D1 from the first semiconductor element 12 to the first side 23a is larger than a distance D2 from the first semiconductor element 12 to the second side 23b. As described above, the first direction is a direction in which the first power terminal 32 projects from the encapsulant 50, and refers to the up-down direction in FIG. 5. As such, disposing the first semiconductor element 12 relatively apart from the first power terminal 32 can suppress transfer of the heat of the first power terminal 32 to the first semiconductor element 12 via the first conductor plate 22.

Particularly, in the semiconductor device 10 in the present embodiment, the distance D1 from the first semiconductor element 12 to the first side 23a is equal to or larger than a half of a size S1 of the first semiconductor element 12 with respect to the first direction. As such, the distance D1 from the first semiconductor element 12 to the first side 23a (which is approximately a distance from the first semiconductor element 12 to the first power terminal 32) is sufficiently larger than that in conventional semiconductor devices. This can effectively suppress transfer of the heat of the first power terminal 32 to the first semiconductor element 12 via the first conductor plate 22.

Additionally, in the semiconductor device 10 in the present embodiment, with respect to the first direction, the distance D1 from the first semiconductor element 12 to the first side 23a is at least twice the distance D2 from the first semiconductor element 12 to the second side 23b. The first semiconductor element 12 is thereby sufficiently offset relative to the center of the first conductor plate 22. This can effectively suppress transfer of the heat of the first power terminal 32 to the first semiconductor element 12 via the first conductor plate 22.

As described above, the semiconductor device 10 in the present embodiment further includes the second conductor plate 24. The second conductor plate 24 is opposed to the first conductor plate 22 with the first semiconductor element 12 interposed therebetween, and includes the main surface 25 connected to the first semiconductor element 12 within the encapsulant 50. Since the second conductor plate 24 is adjacent to the first power terminal 32, it could transfer the heat of the first power terminal 32 to the first semiconductor element 12. In view of this, the first semiconductor element 12 is also offset relative to a center of the second conductor plate 24, to be apart from the first power terminal 32.

Figure 6:
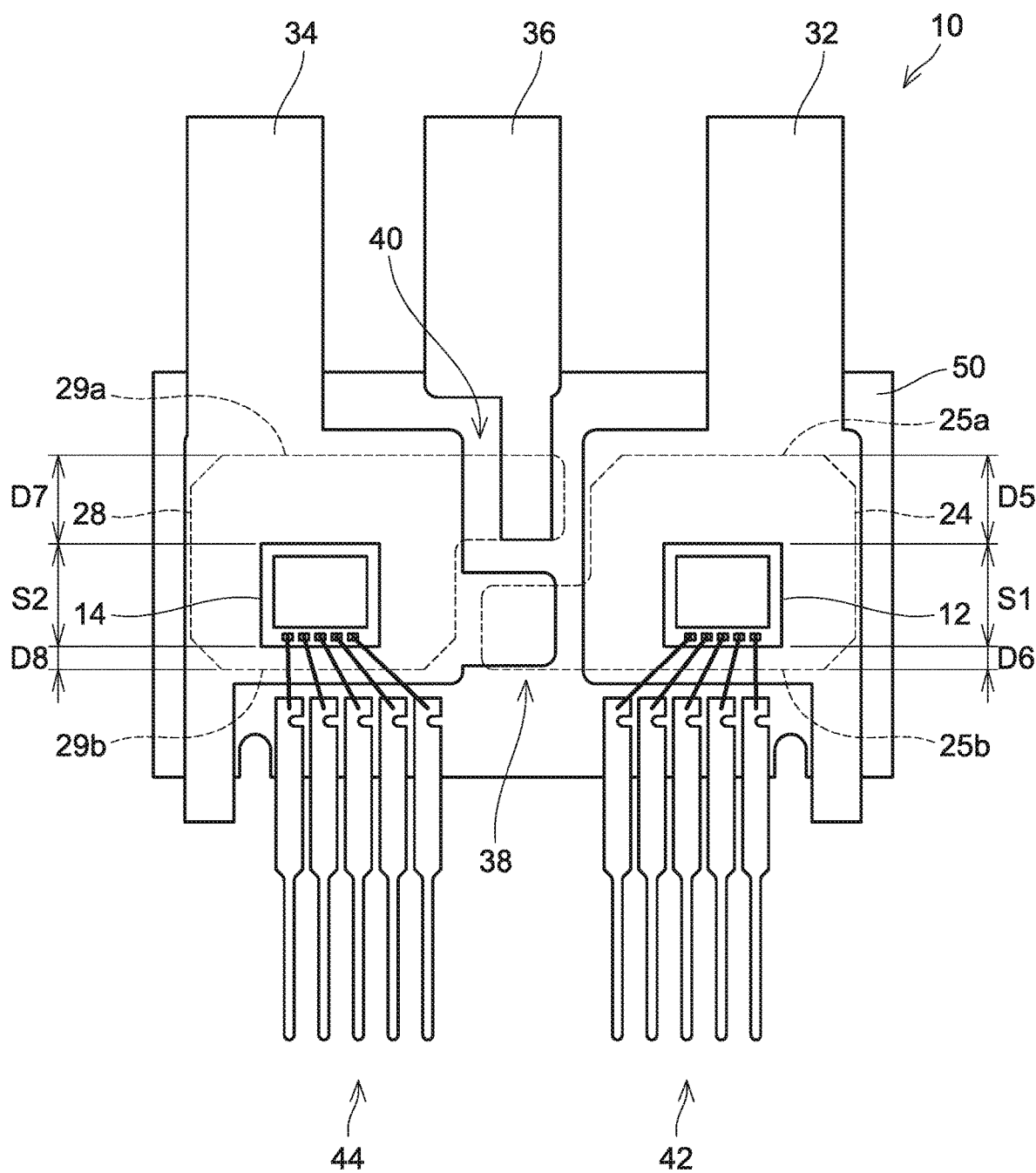
FIG. 6 is a diagram for explaining an arrangement of the first semiconductor element 12 relative to the second conductor plate 24, and an arrangement of the second semiconductor element 14 relative to the fourth conductor plate 28.

Specifically, as shown in FIG. 6, the main surface 25 of the second conductor plate 24 has a generally rectangular shape, and includes a first side 25a located close to the first power terminal 32 and a second side 25b located opposite the first side 25a with respect to the first direction. With respect to the first direction, a distance D5 from the first semiconductor element 12 to the first side 25a of the second conductor plate 24 is larger than a distance D6 from the first semiconductor element 12 to the second side 25b of the second conductor plate 24. This can suppress transfer of the heat of the first power terminal 32 to the first semiconductor element 12 via the encapsulant 50 and the second conductor plate 24 (especially via the second conductor plate 24).

In the second conductor plate 24 as well, the distance D5 from the first semiconductor element 12 to the first side 25a is equal to or larger than the half of the size S1 of the first semiconductor element 12 with respect to the first direction. Additionally, with respect to the first direction, the distance D5 from the first semiconductor element 12 to the first side 25a is at least twice the distance D6 from the first semiconductor element 12 to the second side 25b. These configurations can effectively suppress transfer of the heat of the first power terminal 32 to the first semiconductor element 12 via the encapsulant 50 and the second conductor plate 24.

As described above, the semiconductor device 10 in the present embodiment further includes the third conductor plate 26. The third conductor plate 26 is located side by side with the first conductor plate 22 in a second direction perpendicular to the first direction. The third conductor plate 26 has the second power terminal 34 connected thereto, and the second power terminal 34 extends from the encapsulant 50 along the first direction. In such a structure, heat of the second power terminal 34 could transfer to the second semiconductor element 14 via the third conductor plate 26. In view of this, the second semiconductor element 14 is also offset relative to a center of the third conductor plate 26, to be apart from the second power terminal 34.

Specifically, as shown in FIG. 5, the main surface 27 of the third conductor plate 26 has a generally rectangular shape, and includes a first side 27a located close to the second power terminal 34 and a second side 27b located opposite the first side 27a with respect to the first direction. With respect to the first direction, a distance D3 from the second semiconductor element 14 to the first side 27a of the third conductor plate 26 is larger than a distance D4 from the second semiconductor element 14 to the second side 27b of the third conductor plate 26. Such a configuration can suppress transfer of the heat of the second power terminal 34 to the second semiconductor element 14 via the third conductor plate 26.

In the third conductor plate 26 as well, the distance D3 from the second semiconductor element 14 to the first side 27a is equal to or larger than a half of a size S2 of the second semiconductor element 14 with respect to the first direction. Additionally, with respect to the first direction, the distance D3 from the second semiconductor element 14 to the first side 27a is at least twice the distance D4 from the second semiconductor element 14 to the second side 27b. These configurations can effectively suppress transfer of the heat of the second power terminal 34 to the second semiconductor element 14 via the third conductor plate 26.

As described above, the semiconductor device 10 in the present embodiment further includes the fourth conductor plate 28. The fourth conductor plate 28 is opposed to the third conductor plate 26 with the second semiconductor element 14 interposed therebetween, and includes the main surface 29 connected to the second semiconductor element 14 within the encapsulant 50. Since the fourth conductor plate 28 is adjacent to the second power terminal 34, it could transfer the heat of the second power terminal 34 to the second semiconductor element 14. Moreover, since the fourth conductor plate 28 is connected to the third power terminal 36, it could also transfer heat of the third power terminal 36 to the second semiconductor element 14. In view of this, the second semiconductor element 14 is also offset relative to a center of the fourth conductor plate 28, to be apart from the second power terminal 34 and the third power terminal 36.

Specifically, as shown in FIG. 6, the main surface 29 of the fourth conductor plate 28 has a generally rectangular shape, and includes a first side 29a located close to the second power terminal 34 and a second side 29b located opposite the first side 29a with respect to the first direction. With respect to the first direction, a distance D7 from the second semiconductor element 14 to the first side 29a of the fourth conductor plate 28 is larger than a distance D8 from the second semiconductor element 14 to the second side 29b of the fourth conductor plate 28. This can suppress transfer of the heat of the second power terminal 34 and the third power terminal 36 to the second semiconductor element 14 via the fourth conductor plate 28.

In the fourth conductor plate 28 as well, the distance D7 from the second semiconductor element 14 to the first side 29a is equal to or larger than the half of the size S2 of the second semiconductor element 14 with respect to the first direction. Additionally, with respect to the first direction, the distance D7 from the second semiconductor element 14 to the first side 29a is at least twice the distance D8 from the second semiconductor element 14 to the second side 29b. These configurations can effectively suppress transfer of the heat of the second power terminal 34 and the third power terminal 36 to the second semiconductor element 14 via the fourth conductor plate 28.

Figure 7:
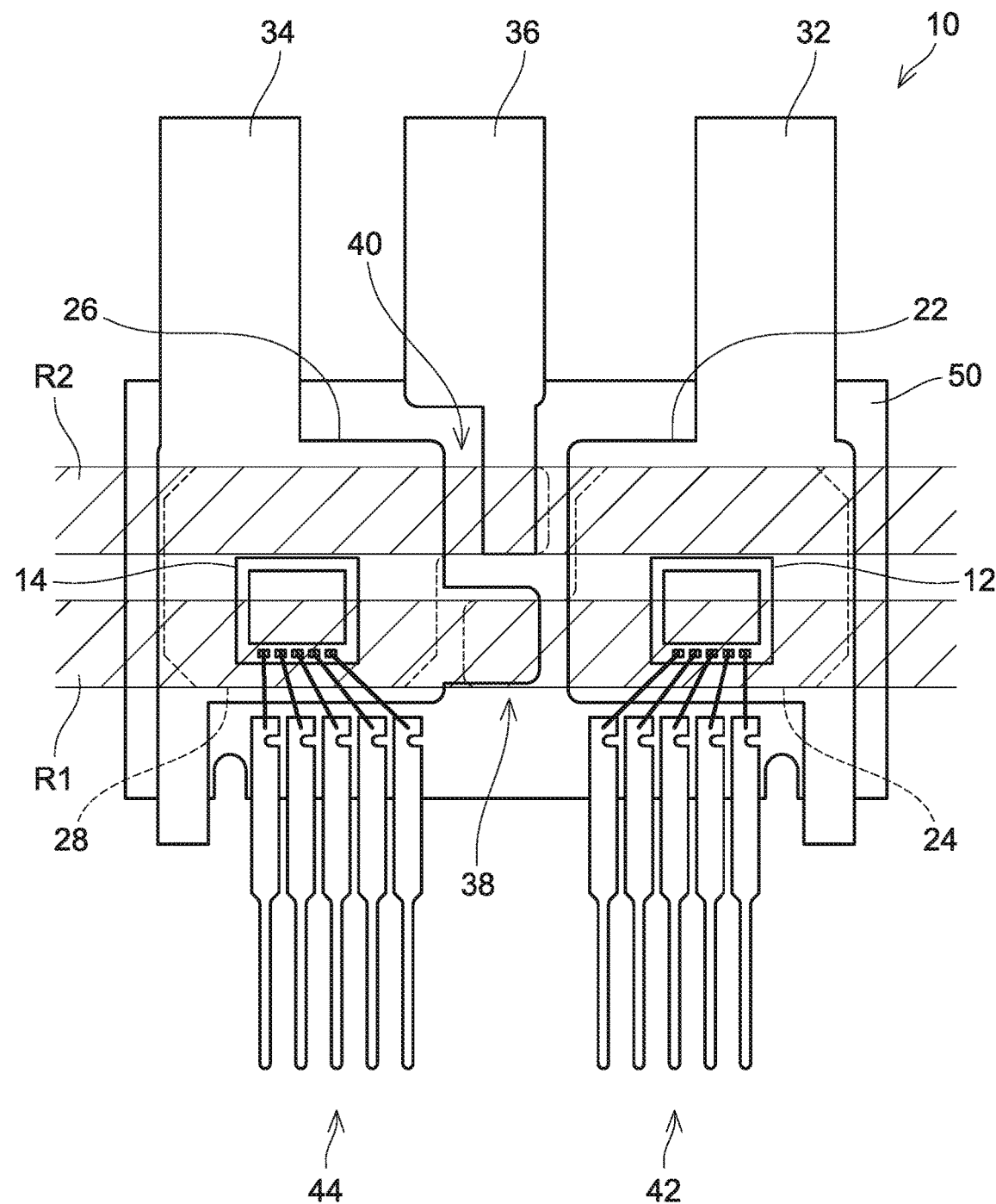
FIG. 7 is a diagram for explaining an arrangement of the first semiconductor element 12 and the second semiconductor element 14 relative to a first connector portion 38, and an arrangement of the first semiconductor element 12 and the second semiconductor element 14 relative to a second connector portion 40.

In the semiconductor device 10 in the present embodiment, the third conductor plate 26 is connected to the second conductor plate 24 via the first connector portion 38 located between the second conductor plate 24 and the third conductor plate 26. Although not particularly limited, the first connector portion 38 may be near the first semiconductor element 12 and the second semiconductor element 14, which shortens paths of current that flows in the semiconductor device 10. Specifically, as shown in FIG. 7, in a plan view along a direction perpendicular to the third conductor plate 26, at least a half of the first semiconductor element 12 and at least a half of the second semiconductor element 14 may each be located within a region R1 that is defined by virtually expanding the first connector portion 38 in the second direction. Such a configuration allows the first connector portion 38 to be disposed sufficiently near the first semiconductor element 12 and the second semiconductor element 14. This shortens a current path between the first semiconductor element 12 and the first connector portion 38, and a current path between the second semiconductor element 14 and the first connector portion 38, so electrical loss in these paths can be reduced.

In the semiconductor device 10 in the present embodiment, the third power terminal 36 is connected to the fourth conductor plate 28 via the second connector portion 40. Although not particularly limited, the second connector portion 40 may be far from the first semiconductor element 12 and the second semiconductor element 14, by which transfer of the heat of the third power terminal 36 to the first semiconductor element 12 and the second semiconductor element 14 can be suppressed. Specifically, as shown in FIG. 7, in a plan view along a direction perpendicular to the fourth conductor plate 28, neither the first semiconductor element 12 nor the second semiconductor element 14 may be located within a region R2 that is defined by virtually expanding the second connector portion 40 in the second direction. Such a configuration allows the first semiconductor element 12 and the second semiconductor element 14 to be located far from the second connector portion 40 and the third power terminal 36, and hence can suppress transfer of the heat of the third power terminal 36 to the first semiconductor element 12 and the second semiconductor element 14.

Figure 8:
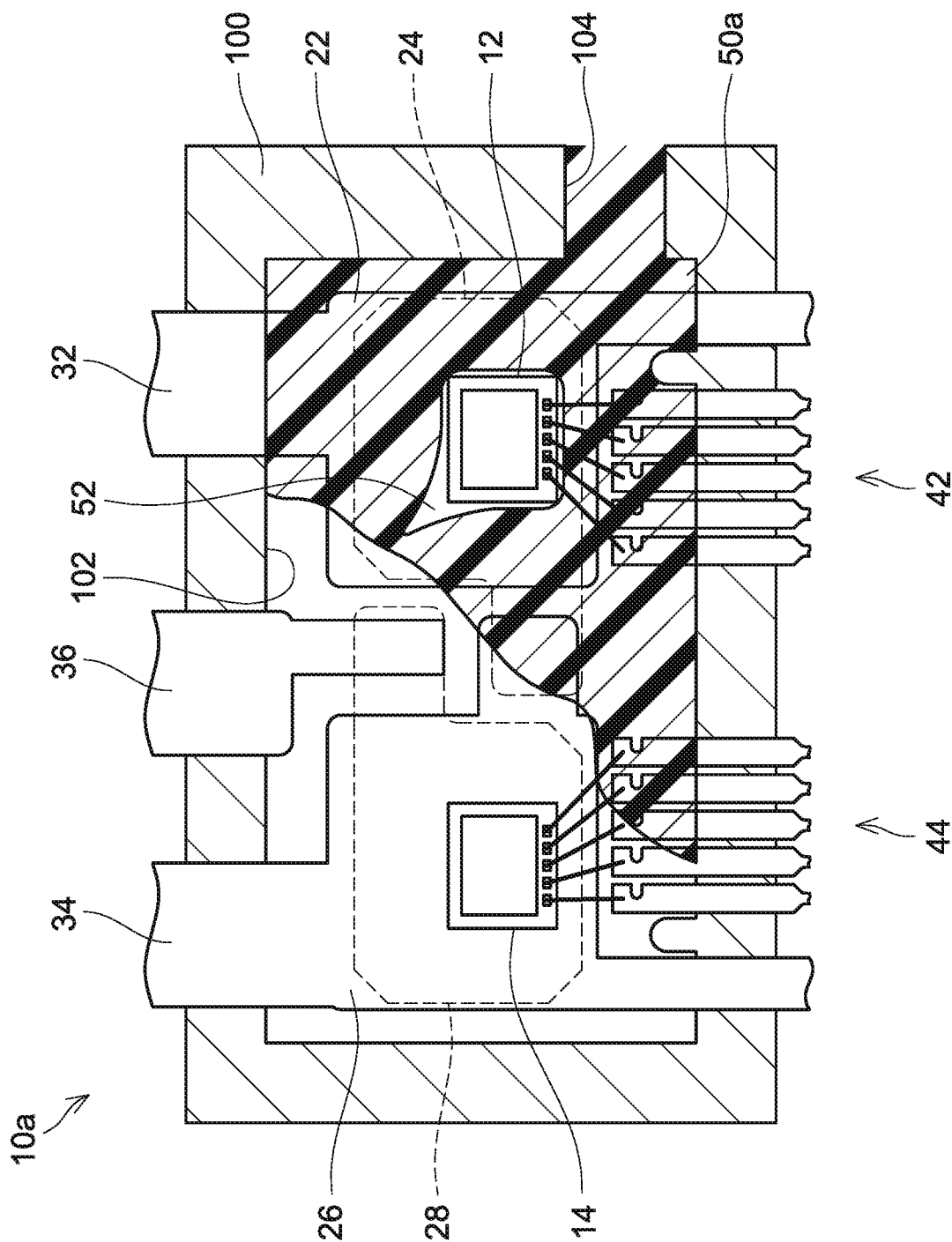
FIG. 8 is a diagram showing a process of molding an encapsulating material 50a with use of a mold at a time point in the process.

Next, a method of manufacturing the semiconductor device 10 will be described. It should be noted that the following description does not limit the method of manufacturing the semiconductor device 10. As shown in FIG. 8, in the method of manufacturing the semiconductor device 10, a semi-finished product 10a of the semiconductor device 10 is set into a cavity 102 of a mold 100. Next, a molten encapsulating material 50a (e.g., an insulating material such as an epoxy resin) is poured into the cavity 102 to mold the encapsulant 50. Here, a configuration of the semi-finished product 10a is equivalent to the configuration of the semiconductor device 10 with the encapsulant 50 removed. It should be noted that one or more of the power terminals 32, 34, 36 and the signal terminals 42, 44 may be integrated in a lead frame.

The mold 100 is provided with a gate 104, from which the encapsulating material 50a flows into the cavity 102. The encapsulating material 50a that have flowed into the cavity 102 proceeds between the first conductor plate 22 and the second conductor plate 24, and between the third conductor plate 26 and the fourth conductor plate 28. Between the first conductor plate 22 and the second conductor plate 24, the encapsulating material 50a is divided to flow on both sides of the first semiconductor element 12, and merges again at a position beyond the first semiconductor element 12. At this time, at the position where the encapsulating material 50a merged, there may be a case where air 52 is confined between the encapsulating material 50a and the first semiconductor element 12. If such air 52 remains in the encapsulant 50 in the finished semiconductor device 10, this could affect, for example, durability of the semiconductor device 10. Especially if the air 52 is located between the first semiconductor element 12 and the encapsulant 50 (i.e., the air 52 is in contact with the first semiconductor element 12), the semiconductor device 10 would be affected in a greater degree.

Figure 9:
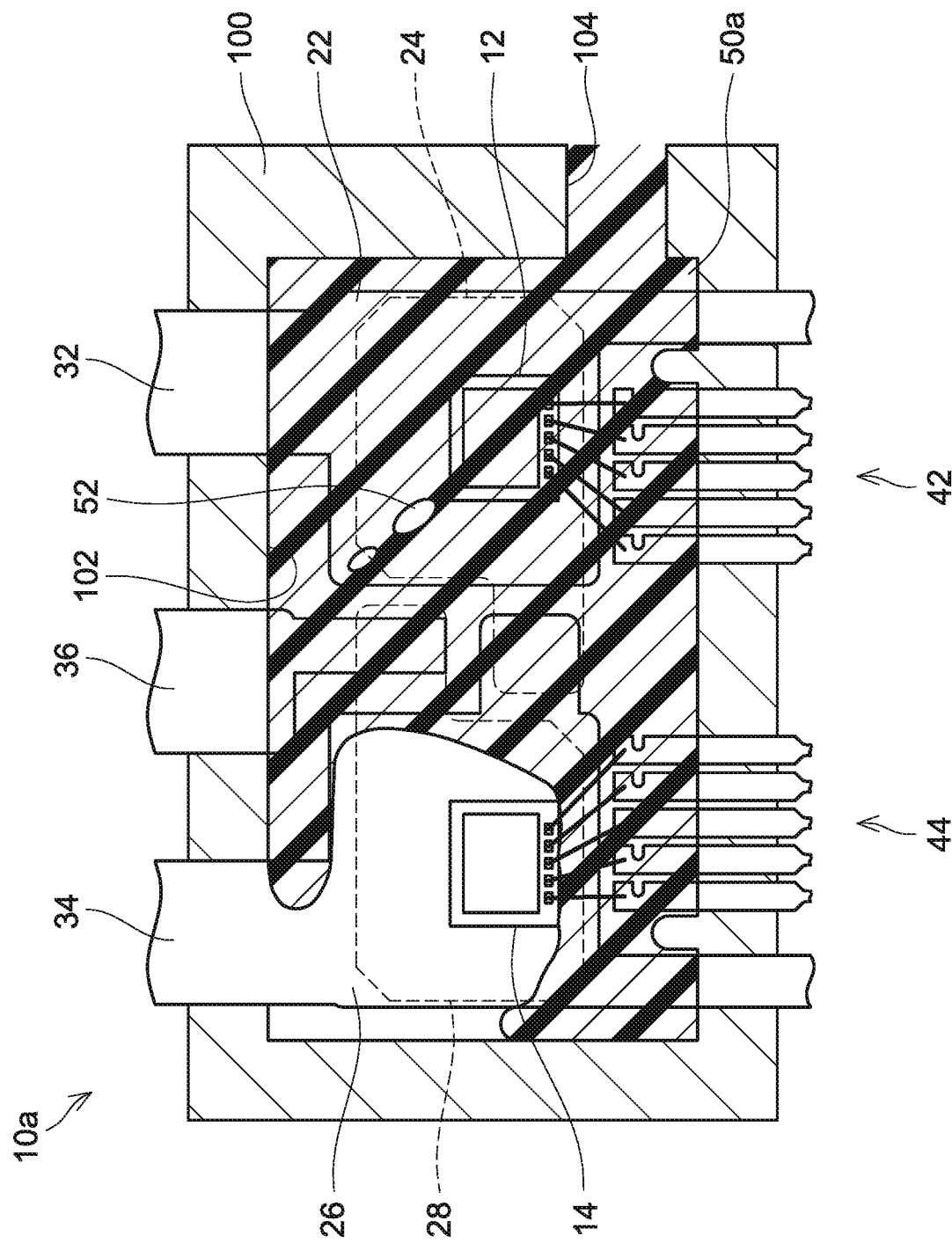
FIG. 9 is a diagram showing the process of molding the encapsulating material 50a with use of the mold at a time point later than the time point in FIG. 8.

As described above, in the semiconductor device 10 in the present embodiment, the first semiconductor element 12 is not located at the center of the first conductor plate 22 or at the center of the second conductor plate 24, but is offset from these centers. In this regard, the same applies to the semi-finished product 10a. The first semiconductor element 12 is relatively near the gate 104 of the mold 100, so the above-described confinement of the air 52 occurs at a relatively early stage. Therefore, after the confinement of the air 52 occurs, the encapsulating material 50a continues to be poured for a relatively long period of time. Consequently, as shown in FIG. 9, the confined air 52 moves away from the first semiconductor element 12 along with the flow of the encapsulating material 50a. As such, even if the air 52 is confined in the encapsulating material 50a, the air 52 (i.e., a bubble) is located apart from the first semiconductor element 12 in the finished semiconductor device 10. Accordingly, even if the air 52 remains in the encapsulant 50, it would affect the semiconductor device 10 in a less degree. The same applies to a space between the third conductor plate 26 and the fourth conductor plate 28, and air that is confined by the encapsulating material 50a is suppressed from remaining in contact with the second semiconductor element 14.

What is claimed is:

1. A semiconductor device comprising:
a first conductor plate;
a first semiconductor element that is a sole semiconductor element disposed on a main surface of the first conductor plate;
an encapsulant encapsulating the first semiconductor element;
a first power terminal connected to the first conductor plate within the encapsulant and projecting from the encapsulant along a first direction;
a second conductor plate opposed to the first conductor plate with the first semiconductor element interposed therebetween, the second conductor plate comprising a main surface connected to the first semiconductor element within the encapsulant;
a third conductor plate located side by side with the first conductor plate in a second direction perpendicular to the first direction;
a second semiconductor element that is a sole semiconductor element disposed on a main surface of the third conductor plate within the encapsulant;
a second power terminal connected to the third conductor plate within the encapsulant and projecting from the encapsulant along the first direction;
a fourth conductor plate opposed to the third conductor plate with the second semiconductor element interposed therebetween; and
a third power terminal connected to the fourth conductor plate within the encapsulant and projecting from the encapsulant along the first direction,
wherein
the main surface of the first conductor plate comprises a first side located close to the first power terminal and a second side located opposite the first side with respect to the first direction,
with respect to the first direction, a distance from the first semiconductor element to the first side is larger than a distance from the first semiconductor element to the second side,
the main surface of the third conductor plate comprises a first side located close to the second power terminal and a second side located opposite the first side with respect to the first direction,
with respect to the first direction, a distance from the second semiconductor element to the first side of the third conductor plate is larger than a distance from the second semiconductor element to the second side of the third conductor plate,
the third conductor plate is connected to the second conductor plate via a first connector portion located between the second conductor plate and the third conductor plate, and
in a plan view along a direction perpendicular to the third conductor plate, at least a half of the first semiconductor element and at least a half of the second semiconductor element are each located within a region defined by virtually expanding the first connector portion in the second direction,
the fourth conductor plate is located side by side with the second conductor plate in the second direction and is connected to the third power terminal via a second connector portion,
in a plan view along a direction perpendicular to the fourth conductor plate, the second connector portion is located between the second conductor plate and the fourth conductor plate and is further located between the third power terminal and the first connector portion, and
in the plan view along the direction perpendicular to the fourth conductor plate, neither the first semiconductor element nor the second semiconductor element is located within a region defined by virtually expanding the second connector portion in the second direction.

2. The semiconductor device according to claim 1, wherein the distance from the first semiconductor element to the first side is equal to or larger than a half of a size of the first semiconductor element with respect to the first direction.

3. The semiconductor device according to claim 1, wherein with respect to the first direction, the distance from the first semiconductor element to the first side is at least twice the distance from the first semiconductor element to the second side.

4. The semiconductor device according to claim 1, wherein the main surface of the second conductor plate comprises a first side located close to the first power terminal and a second side located opposite the first side with respect to the first direction, and with respect to the first direction, a distance from the first semiconductor element to the first side of the second conductor plate is larger than a distance from the first semiconductor element to the second side of the second conductor plate.

* * * * *